(12) United States Patent
Lee

(10) Patent No.: US 11,495,492 B2
(45) Date of Patent: Nov. 8, 2022

(54) METHOD OF FABRICATING SEMICONDUCTOR DEVICE

(71) Applicant: Winbond Electronics Corp., Taichung (TW)

(72) Inventor: Cheng-Che Lee, Taichung (TW)

(73) Assignee: Winbond Electronics Corp., Taichung (TW)

( * ) Notice: Subject to any disclaimer, the term of this patent is extended or adjusted under 35 U.S.C. 154(b) by 196 days.

(21) Appl. No.: 17/015,078

(22) Filed: Sep. 9, 2020

(65) Prior Publication Data

US 2021/0265197 A1 Aug. 26, 2021

(30) Foreign Application Priority Data

Feb. 25, 2020 (TW) .................................. 109106037

(51) Int. Cl.
*H01L 21/768* (2006.01)
(52) U.S. Cl.
CPC ................................ *H01L 21/7684* (2013.01)

(58) Field of Classification Search
CPC ............ H01L 21/7684; H01L 21/76885; H01L 23/5283
See application file for complete search history.

(56) References Cited

U.S. PATENT DOCUMENTS

| 6,103,635 A * | 8/2000 | Chau .................... H01L 21/3065 257/E21.546 |
| 2016/0300793 A1* | 10/2016 | Hartswick ............ H01L 23/5227 |
| 2021/0057333 A1* | 2/2021 | Tsai ................... H01L 21/76816 |

* cited by examiner

*Primary Examiner* — Julia Slutsker
(74) *Attorney, Agent, or Firm* — JCIPRNET

(57) ABSTRACT

Provided is a method for manufacturing a semiconductor device, including: forming a conductive layer on the first dielectric layer; forming a recess in the conductive layer; performing a first etching process to round a top corner of the recess; performing a second etching process to remove the conductive layer exposed from a bottom surface of the recess and thereby forming an opening having a rounding top corner in the conductive layer; and forming a second dielectric layer in the opening.

10 Claims, 3 Drawing Sheets

METHOD OF FABRICATING SEMICONDUCTOR DEVICE

CROSS-REFERENCE TO RELATED APPLICATION

This application claims the priority benefit of Taiwan application serial no. 109106037, filed on Feb. 25, 2020. The entirety of the above-mentioned patent application is hereby incorporated by reference herein and made a part of this specification.

BACKGROUND

Technical Field

The present invention relates to a method for manufacturing an integrated circuit device, and more particularly, to a method for manufacturing a semiconductor device.

Description of Related Art

As semiconductor devices continue to shrink in size, the distance between metal lines is getting smaller and smaller. Micro-bridges often occur between metal lines due to metal residues caused by process factors, which leads to the reliability issue of integrated circuits.

SUMMARY

The present invention provides a method for manufacturing a semiconductor device, which can avoid micro bridges between metal lines and improve the reliability of the integrated circuit.

The present embodiment provides method for manufacturing a semiconductor device, including: forming a conductive layer, a buffer layer and a hard mask layer on the first dielectric layer; forming a patterned mask layer on the hard mask layer; using a patterned mask layer as a mask, performing a first etching process to pattern the hard mask layer and the buffer layer, and to form a recess in the conductive layer; removing the patterned mask layer; selectively removing a portion of the buffer layer to expose a top corner of the recess; performing a second etching process to round the top corner of the recess; performing a third etching process to remove the conductive layer exposed from a bottom surface of the recess to form a plurality of conductive lines with a rounding top corner; removing the hard mask layer and the buffer layer; and forming a second dielectric layer on the plurality of conductive lines and between the plurality of conductive lines.

The present embodiment also provides a method for manufacturing a semiconductor device, including: forming a conductive layer on the first dielectric layer; forming a recess in the conductive layer; performing a first etching process to round a top corner of the recess; performing a second etching process to remove the conductive layer exposed from a bottom surface of the recess and thereby forming an opening having a rounding top corner in the conductive layer; and forming a second dielectric layer in the opening.

According to the method of manufacturing the semiconductor device of the present embodiment, the top corners of the conductive layer have been rounded before the second dielectric layer deposition process, and thus the step coverage of the second dielectric layer is improved. The deposition process for the second dielectric layer will no longer be sputtered to avoid micro bridges between metal lines and improve the reliability of the integrated circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIGS. 1A to 1F are schematic cross-sectional views illustrating a manufacturing process of a semiconductor device according to an embodiment of the present invention.

Figure 1A:
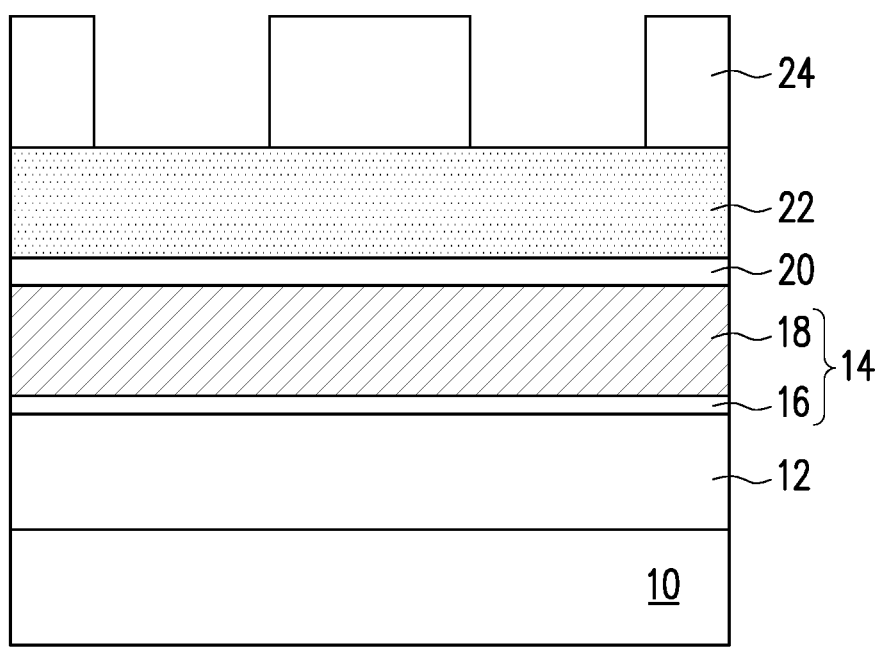
FIGS. 1A to 1F are schematic cross-sectional views illustrating a manufacturing process of a semiconductor device according to an embodiment of the present invention.

Referring to FIG. 1A, a first dielectric layer 12 is formed on a substrate 10. The substrate 10 may be a semiconductor substrate, such as a silicon substrate. The first dielectric layer 12 is, for example, an inner layer dielectric (ILD) layer or an intermetal dielectric layer (IMD). The first dielectric layer 12 is, for example, silicon oxide formed by a chemical vapor deposition method.

A conductive layer 14 is formed on the first dielectric layer 12. The conductive layer 14 may be a metal layer 18. The conductive layer 14 may further include a barrier layer 16 between the metal layer 18 and the first dielectric layer 12. The barrier layer 16 is, for example, titanium, titanium nitride, or a combination thereof. The metal layer 18 is, for example, tungsten.

After that, a buffer layer 20 and a hard mask layer 22 are formed on the conductive layer 14. The material of the buffer layer 20 may include silicon oxide, silicon nitride, silicon oxynitride, silicon carbon nitride, silicon oxycarbide, carbon, spin-on carbon (SoC), phosphosilicate glass (PSG), borosilicate glass (BSG), borophosphosilicate glass (BPSG) or a combination thereof. Thereafter, a patterned mask layer 24 is formed on the hard mask layer 22. The patterned mask layer 24 is, for example, a photoresist pattern.

Figure 1B:
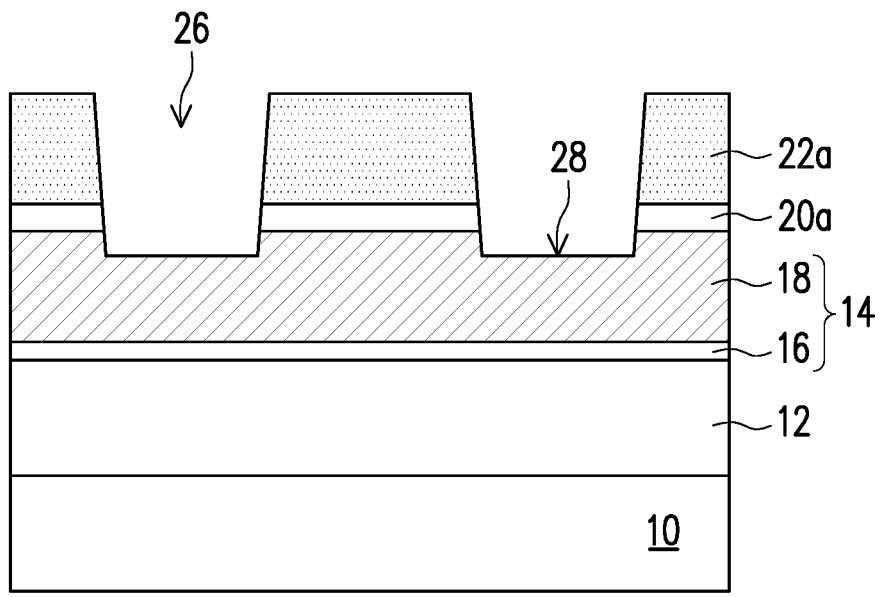

FIG. 1B, using a patterned mask layer 24 as a mask, an etching process such as an isotropic etching process is performed to form a patterned hard mask layer 22a and a buffer layer 20a with openings 26, and form recesses 28 in the conductive layer 14. The patterned mask layer 24 is removed afterwards.

Figure 1C:
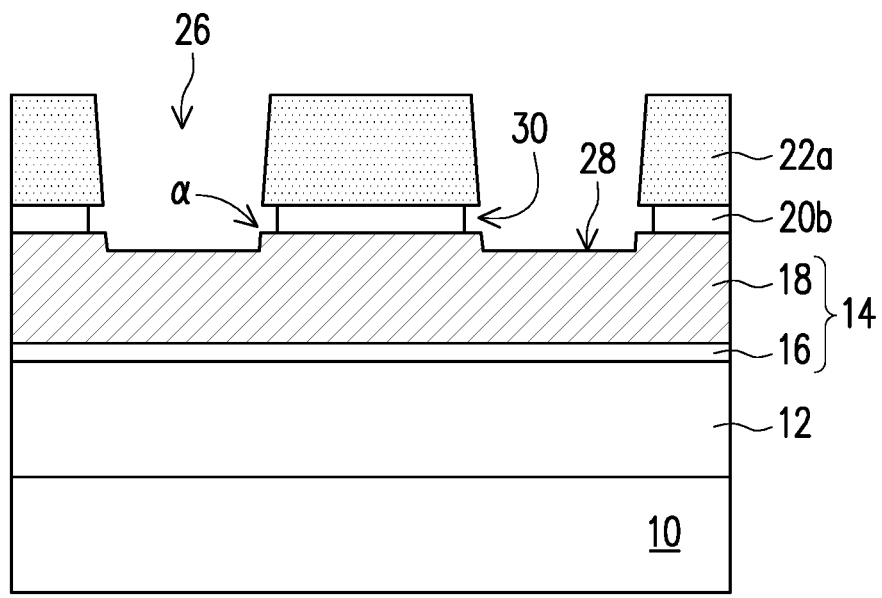

Referring to FIG. 1C, a pull back process is performed on the buffer layer 20a to selectively remove the buffer layer 20a of the exposed portion of the sidewalls of the openings 26 to form a buffer layer 20b having recesses 30. The recesses 30 expose the top corners of the recesses 28. The pull-back process is, for example, an isotropic etching process. The isotropic etching process can be a wet etching process or a dry etching process. The etching selectivity between the buffer layer 20a and the metal layer 18 is, for example, 30:1 to 50:1. The wet etching process may use hydrofluoric acid solution or buffered oxide etching solution (BOE) as the etchant. The dry etching process may be performed after patterning the hard mask layer 22a and the buffer layer 20a without vacuum breaking, and using in-situ $CF_4$ as an etching gas.

Figure 1D:
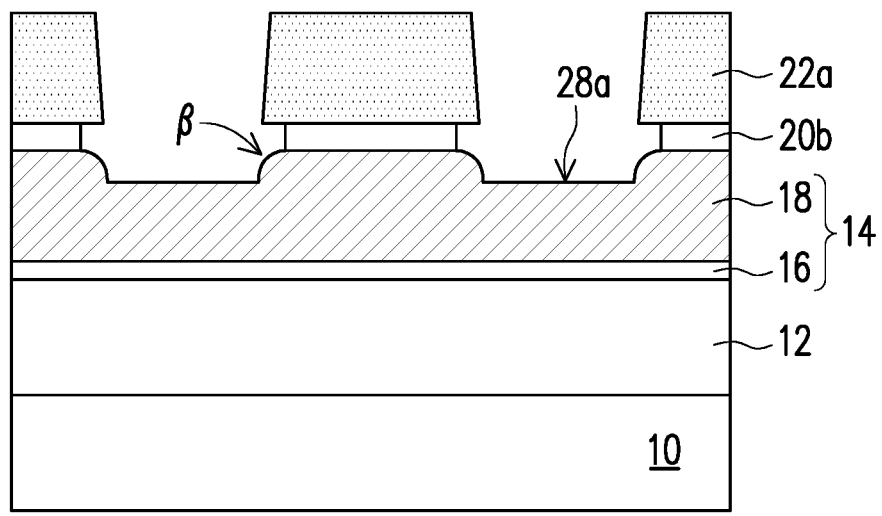

Referring FIG. 1D, an etching process is performed on the exposed metal layer 18 at the top corners α of the recesses 28 to form a recess 28a having rounding corners β. The dry etching process may be performed by using $CF_4$ as the etching gas in situ without vacuum breaking after performing the pull-back process.

Figure 1E:
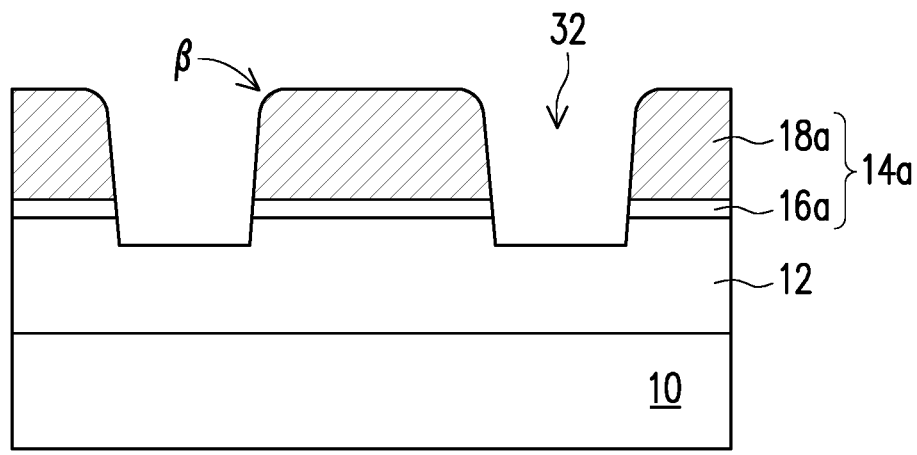

Referring to FIG. 1E, an anisotropic etching process such as a dry etching process is performed to remove the exposed conductive layer 14 on the bottom surface of the recess 28a to form a plurality of conductive lines 14a having the rounding corners β and openings 32 having the rounding corners β. Each conductive layer 14a includes a barrier layer 16a and a metal layer 18a. The openings 32 are, for example, elongated trenches, which separates a plurality of conductive lines 14a from each other. In some embodiments, the etching process also over etches a portion of the first dielectric layer 12 to ensure that a plurality of conductive lines 14a may be separated from each other. Because openings 32 have the rounding corners β, it is beneficial to the step coverage of a second dielectric layer 34 (shown in FIG. 1F) formed later. The dry etching process may be performed by using $CF_4$ as the etching gas in situ without vacuum breaking after the top corners α are etched.

Thereafter, an etching process such as an isotropic or anisotropic etching process may be performed to remove the hard mask layer 22a and the buffer layer 20b.

Figure 1F:
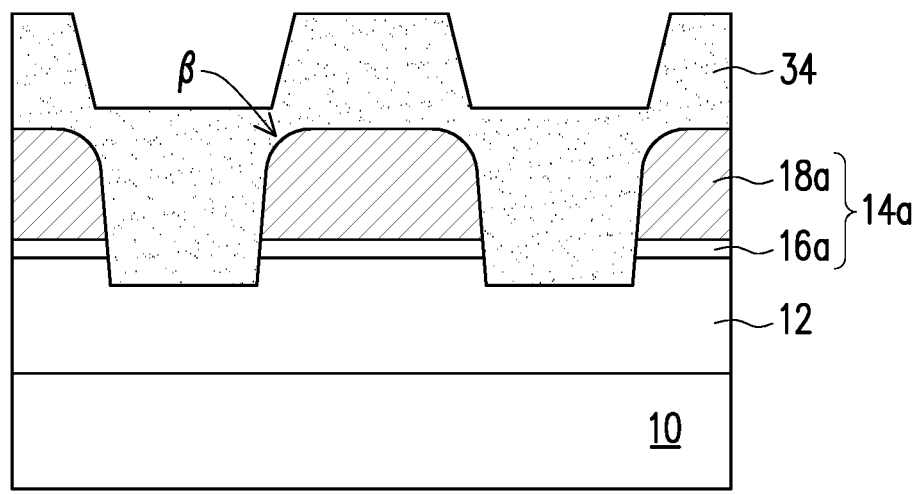

Referring to FIG. 1F, the second dielectric layer 34 is formed on a plurality of conductive lines 14a and in the openings 32. The second dielectric layer 34 is, for example, a silicon oxide layer formed by a high-density plasma deposition method. Since the top corners β of the recesses 28a has been rounded first, the plasma that is bombarded by high-density plasma deposition will hardly cut the top corners β, so the issue of the micro bridge derived from metal residue caused by cutting the top corner of the conductive lines can be avoided.

According to the present embodiment, the conductive lines with rounding corners are first formed, and then the second dielectric layer is formed. Therefore, it is possible to avoid the issue of the micro bridge caused by cutting the top corners of the conductive lines due to the deposition of the second dielectric layer.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for manufacturing a semiconductor device, comprising:
    forming a conductive layer, a buffer layer and a hard mask layer on the first dielectric layer;
    forming a patterned mask layer on the hard mask layer;
    using a patterned mask layer as a mask, performing a first etching process to pattern the hard mask layer and the buffer layer, and to pattern the conductive layer to form a recess in the conductive layer;
    removing the patterned mask layer after the conductive layer is patterned;
    selectively removing a portion of the buffer layer to expose a top corner of the recess;
    performing a second etching process to round the top corner of the recess;
    performing a third etching process to remove the conductive layer exposed from a bottom surface of the recess to form a plurality of conductive lines having rounding top corners;
    removing the hard mask layer and the buffer layer; and
    forming a second dielectric layer on the plurality of conductive lines and between the plurality of conductive lines.

2. The method of claim 1, wherein the buffer layer includes silicon oxide, silicon nitride, silicon oxynitride, silicon carbon nitride, silicon oxycarbide, carbon, spin-on carbon, phosphorous silicon glass, borosilicate glass, borophosphosilicate glass, or a combination thereof.

3. The method of claim 1, wherein the selectively removing the portion of the buffer layer comprises an isotropic etching process.

4. The method of claim 1, wherein the second dielectric layer is formed by a high-density plasma deposition method, and top corners of the conductive layer are not cut when the high-density plasma deposition method is performed.

5. The method of claim 1, wherein each of the steps of the removing the patterned mask layer, the selectively removing the portion of the buffer layer, the performing second etching process, and the performing the third etching comprises a dry etching process performed in situ without vacuum breaking.

6. A method for manufacturing a semiconductor device, comprising:
    forming a conductive layer on a first dielectric layer;
    forming a recess in a top portion of the conductive layer;
    exposing a first portion of a top surface of the conductive layer, and masking a second portion of the top surface of the conductive layer to expose a top corner of the recess;
    performing a first etching process to round the top corner of the recess;
    performing a second etching process to remove a bottom portion of the conductive layer exposed from a bottom surface of the recess, and thereby forming an opening having a top rounding corner; and
    forming a second dielectric layer in the opening having the top rounding corner.

7. The method of claim 6, wherein the step of forming the recess in the conductive layer comprises:
    forming a buffer layer, a hard mask layer, and a patterned mask layer on the conductive layer; and
    patterning the hard mask layer and the buffer layer, and forming the recess in the conductive layer; and
    wherein the method further comprises:
    selectively remove a portion of the buffer layer to expose the top corner of the recess before the performing the first etching process.

8. The method of claim 6, wherein the step of the performing the first etching process comprises a dry etching process performed in situ without vacuum breaking.

9. The method of claim 6, wherein the second dielectric layer is formed by a high-density plasma deposition method, and top corners of the conductive is not cut when the high-density plasma deposition method is performed.

10. The method of claim 6, wherein the opening comprises an elongated trench.

* * * * *